US012372376B1

United States Patent
Matta et al.

(10) Patent No.: US 12,372,376 B1
(45) Date of Patent: Jul. 29, 2025

(54) AI ASSISTED CALIBRATION OF IMUS

(71) Applicant: AIM Design, LLC, Appleton, WI (US)

(72) Inventors: Anders Irving Matta, Woodside, CA (US); Randolph Beauregard Robert, III, Delaware, OH (US); Matthew Joseph Messinger, Madison, WI (US)

(73) Assignee: AIM Design, LLC, Appleton, WI (US)

( * ) Notice: Subject to any disclaimer, the term of this patent is extended or adjusted under 35 U.S.C. 154(b) by 0 days.

(21) Appl. No.: 19/047,136

(22) Filed: Feb. 6, 2025

Related U.S. Application Data

(63) Continuation of application No. 19/042,395, filed on Jan. 31, 2025.

(51) Int. Cl.
*G01C 25/00* (2006.01)
*G05B 23/02* (2006.01)
*G06F 30/27* (2020.01)

(52) U.S. Cl.
CPC ......... *G01C 25/005* (2013.01); *G05B 23/024* (2013.01); *G05B 23/0283* (2013.01); *G05B 23/0294* (2013.01); *G06F 30/27* (2020.01)

(58) Field of Classification Search
CPC ................ G01C 25/005; G05B 23/024; G05B 23/0283; G05B 23/0294; G06F 30/27
See application file for complete search history.

(56) References Cited

U.S. PATENT DOCUMENTS

| | | | | |
|---|---|---|---|---|
| 6,774,885 B1* | 8/2004 | Even-Zohar | ......... | A61B 5/4023 434/247 |
| 10,509,469 B2* | 12/2019 | Erivantcev | .............. | G06F 3/017 |
| 10,722,165 B1* | 7/2020 | Douglas | ................. | A61B 5/163 |
| 10,905,383 B2* | 2/2021 | Barachant | ............ | A61B 5/6831 |
| 10,976,863 B1* | 4/2021 | Erivantcev | ................ | G06T 7/75 |
| 2009/0248244 A1* | 10/2009 | Sumimoto | ......... | B60H 1/00735 701/36 |

(Continued)

OTHER PUBLICATIONS

Stepanova et al., Robot self-calibration using multiple kinematic chains—a simulation study on the iCub humanoid robot, IEEE, 2019 (Year: 2019).*

(Continued)

*Primary Examiner* — Mohammad K Islam
(74) *Attorney, Agent, or Firm* — CASIMIR JONES, S.C.; Thomas J. Lyneis

(57) ABSTRACT

Provided herein are methods for Inertial Measurement Unit (IMU) sensor compensation utilizing deep neural network (DNN) technology. In some embodiments, the methods involve receiving sensor values from gyroscopes, accelerometers, and non-motion sensors, then loading these values into a deep learning algorithm alongside true sensor values. Unlike traditional calibration techniques that rely on complex parametric models, this approach may utilize a neural network to directly process raw sensor data and enhance output signal accuracy. In some embodiments, the training process employs ground truth data for approximately 70% of inputs, with the remaining 30% dedicated to sensor compensation. The technique may be implemented in standalone IMUs, augmented IMUs, and navigation systems, offering improved accuracy and reduced computational overhead across various technological applications.

20 Claims, 9 Drawing Sheets

(56) References Cited

U.S. PATENT DOCUMENTS

| | | | | |
|---|---|---|---|---|
| 2016/0134299 | A1* | 5/2016 | Lowe | G01D 5/16 |
| | | | | 341/15 |
| 2017/0144021 | A1* | 5/2017 | Glenn | A63B 60/46 |
| 2017/0147066 | A1* | 5/2017 | Katz | G06F 3/0346 |
| 2018/0020978 | A1* | 1/2018 | Kaifosh | G06F 3/017 |
| | | | | 702/150 |
| 2018/0275762 | A1* | 9/2018 | Freeman | G06F 3/0482 |
| 2020/0193691 | A1* | 6/2020 | Mishra | G06T 7/97 |
| 2020/0311514 | A1* | 10/2020 | Speranzon | G01C 25/005 |
| 2020/0355503 | A1* | 11/2020 | Chen | G01C 19/00 |
| 2022/0066544 | A1* | 3/2022 | Kwon | G06V 20/41 |
| 2022/0088988 | A1* | 3/2022 | Menden | B60G 17/01908 |
| 2022/0100282 | A1* | 3/2022 | Nocon | G06F 3/0346 |
| 2022/0206566 | A1* | 6/2022 | Senkal | G06T 7/70 |
| 2022/0409144 | A1* | 12/2022 | Priem | A61B 5/0205 |
| 2023/0214027 | A1* | 7/2023 | Erivantcev | G06F 3/017 |
| | | | | 345/156 |
| 2024/0023833 | A1* | 1/2024 | Schröder | A61B 5/6829 |

OTHER PUBLICATIONS

Hoffmann, Body models in humans, animals, and robots: mechanisms and plasticity (Year: 2022).*

Kelly, Visual-Inertial Simultaneous Localization, Mapping and Sensor-to-Sensor Self-Calibration, IEEE (Year: 2009).*

\* cited by examiner

AI ASSISTED CALIBRATION OF IMUS

CROSS-REFERENCE TO RELATED APPLICATION

The present application is a continuation of U.S. application Ser. No. 19/042,395, filed Jan. 31, 2025, which is incorporated herein by reference in its entirety.

TECHNICAL FIELD

The present disclosure relates to inertial measurement unit (IMU) sensor networks with integrated artificial intelligence processing. Specifically, the invention encompasses advanced sensor systems that utilize deep neural network architectures to process raw sensor data for enhanced motion tracking, position estimation, and navigation applications. The technological domain spans robotics, motion analysis, navigation systems, and edge computing, with particular emphasis on improving sensor accuracy, reducing computational overhead, and enabling real-time intelligent processing of inertial and environmental sensor data.

BACKGROUND

Inertial Measurement Units (IMUs) are critical components in numerous technological applications, including navigation systems for aircraft, unmanned aerial vehicles, spacecraft, satellites, waterborne craft, guided missiles, and other precision motion-tracking platforms. These sensor systems rely on a combination of motion sensors, primarily accelerometers and gyroscopes, to sense and report the motion, angular rate, and directional characteristics of a vehicle or object. However, the effectiveness of IMUs has been historically constrained by significant calibration challenges.

Traditional IMU sensor compensation techniques have relied heavily on least squares or polynomial fitting methods, which require users to possess a deep understanding of sensor physics and the complex environmental factors that impact sensor performance. The (Rate) Table Calibration (TCAL) process, a prominent existing method, utilizes a parametric model that involves complex mathematical transformations of raw sensor data. This approach demands extensive knowledge of sensor characteristics and how environmental conditions like temperature and air pressure affect sensor accuracy and reliability.

The conventional TCAL method employs a mathematical model that accounts for various sensor imperfections, including misalignment between axes and scale factor variations. Researchers and engineers have long struggled with the limitations of these traditional calibration techniques, which require intricate manual intervention and are prone to significant error margins. The complexity of creating accurate parametric models has been a persistent challenge in IMU technology, often necessitating extensive manual calibration and specialized expertise to achieve acceptable performance.

These limitations have created a critical need for more advanced, intelligent approaches to IMU sensor compensation that can overcome the inherent shortcomings of traditional calibration methods. The emergence of deep learning and artificial intelligence technologies presents a promising solution to these long-standing challenges in inertial sensing technology, offering the potential for more accurate, adaptive, and robust sensor performance across diverse operational environments.

SUMMARY

The present disclosure provides, in at least one aspect, methods including receiving sensor data from a plurality of inertial measurement unit (IMU) sensors, processing the sensor data using a neural network implemented on a processing device, generating position and orientation data based on the processed sensor data, and creating a virtual model by networking multiple IMU sensors together, wherein the virtual model incorporates physical constraints of a system being monitored.

In some embodiments, the neural network comprises a model trained for specific movement patterns.

In some embodiments, the method further includes monitoring kinematic parameters of the system being monitored, detecting conditions based on the monitored parameters, and triggering response mechanisms when specific conditions are detected.

In some embodiments, the virtual model enables collision prediction by maintaining a real-time model of components and their spatial relationships.'

The present disclosure provides, in at least another aspect, systems including a plurality of sensor nodes, each sensor node including an IMU sensor board, a processor configured to implement AI processing, and an enclosure, wherein the sensor nodes are networked together to form a virtual model.

In some embodiments, each sensor node includes a wireless communication module for data transmission between sensor nodes.

In some embodiments, the processor implements neural network architectures.

In some embodiments, the system further includes environmental sensors providing compensation for environmental effects.

In some embodiments, the method further includes collecting simulation data under varying conditions, training the neural network based on the collected simulation data, wherein the training includes, training different movement patterns, incorporating movement constraints specific to each movement pattern, and collecting operational data during deployment and updating the neural network based on usage patterns.

In some embodiments, the method further includes collecting operational data during deployment, and updating the neural network models based on usage patterns.

The present disclosure provides, in yet another aspect, systems for motion tracking, including a plurality of IMU sensor nodes networked together, each sensor node comprising a processor implementing a neural network model, wherein the networked sensor nodes form a virtual model incorporating physical constraints of a system being monitored.

In some embodiments, the system further includes an interface providing visualization of the virtual model, and integration capabilities with control systems.

In some embodiments, the processor implements predictive analysis to detect potential issues based on monitored parameters.

The present disclosure provides, in at least another aspect, methods for validating a networked IMU system, including executing movement patterns, comparing IMU-derived position data against reference measurements, and validating virtual model accuracy using external reference data.

In some embodiments, validating virtual model accuracy includes generating a reference model using sensor data, and comparing the IMU-based virtual model against the reference model.

In some embodiments, the processor implements uncertainty quantification mechanisms to provide confidence levels for position and orientation predictions.

In some embodiments, the virtual model self-calibrates using context constraints specific to each sensor node location.

In some embodiments, processing the sensor data comprises directly processing raw voltage values from the IMU sensors without pre-calibration or pre-processing steps.

In some embodiments, the neural network model implements a hybrid architecture combining temporal processing through LSTM or GRU layers with spatial feature extraction through CNN layers specialized for three-dimensional IMU data.

In some embodiments, the processor implements adaptive processing capabilities to dynamically adjust processing based on current conditions and requirements, optimizing between accuracy and computational efficiency.

Other aspects of the disclosure will become apparent by consideration of the detailed description and accompanying drawings.

BRIEF DESCRIPTION OF THE DRAWINGS

These and other features, aspects, and advantages of the present technology will become better understood with regard to the following drawings.

Figure 1:
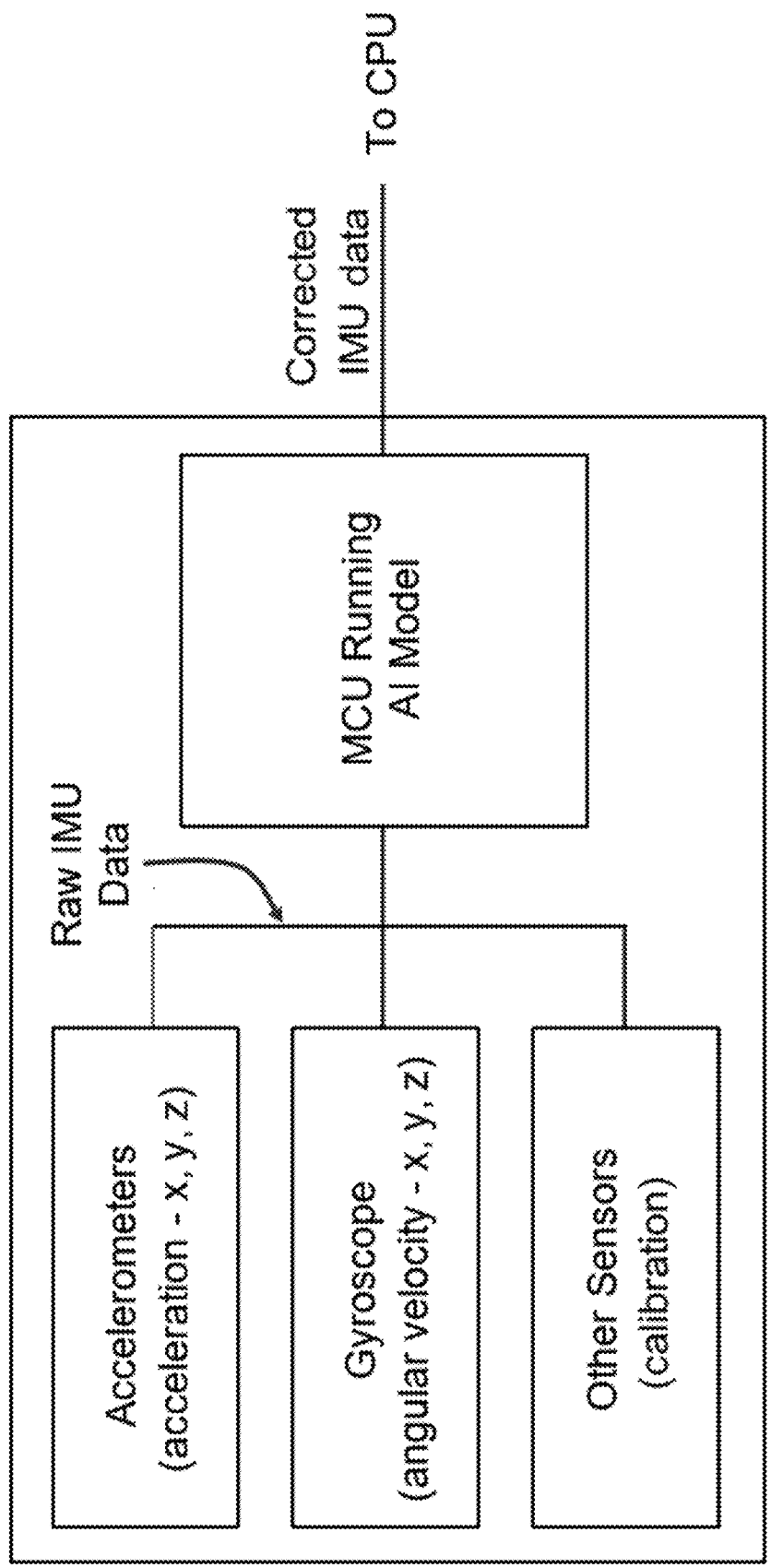
FIG. 1 is a schematic block diagram depicting an Inertial Measurement Unit (IMU) sensor node according to one embodiment of the present disclosure, illustrating the key components including gyroscopes, accelerometers, other sensors, and the neural network processing system.

Before any embodiments are explained in detail, it is to be understood that the present disclosure is not limited in its application to the details of construction and the arrangement of components set forth in the following description or illustrated in the accompanying drawings. The present disclosure is capable of other embodiments and of being practiced or of being carried out in various ways.

Definitions

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments may be readily combined, without departing from the scope or spirit of the invention.

In addition, as used herein, the term "or" is an inclusive "or" operator and is equivalent to the term "and/or" unless the context clearly dictates otherwise. The term "based on" is not exclusive and allows for being based on additional factors not described, unless the context clearly dictates otherwise. In addition, throughout the specification, the meaning of "a", "an", and "the" include plural references. The meaning of "in" includes "in" and "on."

As used herein, the terms "about", "approximately", "substantially", and "significantly" are understood by persons of ordinary skill in the art and will vary to some extent on the context in which they are used. If there are uses of these terms that are not clear to persons of ordinary skill in the art given the context in which they are used, "about" and "approximately" mean plus or minus less than or equal to 10% of the particular term and "substantially" and "significantly" mean plus or minus greater than 10% of the particular term.

As used herein, a "system" refers to a plurality of real and/or abstract components operating together for a common purpose. In some embodiments, a "system" is an integrated assemblage of hardware and/or software components. In some embodiments, each component of the system interacts with one or more other components and/or is related to one or more other components. In some embodiments, a system refers to a combination of components and software for controlling and directing methods.

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing of the present disclosure. All publications, patent applications, patents and other references mentioned herein are incorporated by reference in their entirety. The materials, methods, and examples disclosed herein are illustrative only and not intended to be limiting.

DETAILED DESCRIPTION

In the following detailed description, reference is made to the accompanying drawings that form a part hereof, and in which is shown by way of illustration specific embodiments in which the disclosure may be practiced. It is to be understood that other embodiments may be utilized, and that logical, mechanical, and electrical changes may be made without departing from the scope of the present disclosure. The following detailed description is, therefore, not to be taken in a limiting sense.

Overview of IMU System

Embodiments of the present disclosure provide systems and methods for advanced inertial measurement unit (IMU) sensor networks with integrated artificial intelligence processing. The disclosed embodiments significantly improve accuracy and reduce computational overhead compared to traditional IMU implementations by utilizing deep learning techniques and real-time edge processing. While specific embodiments are described herein, the scope of the invention is not limited to these particular configurations, and alternative arrangements may be implemented within the spirit and scope of the disclosure.

A distinguishing feature of the present disclosure is its innovative approach to sensor data processing. Unlike traditional systems that rely heavily on pre-calibration and sensor fusion with external sensors, the present system processes raw sensor voltage values directly to generate highly accurate position and orientation data while minimizing computational overhead. This approach represents a significant departure from conventional methods that depend on lookup tables and manufacturer calibration data. In alternative embodiments, the system may incorporate selective pre-processing steps while maintaining the core innovation of direct voltage processing.

The system's architecture is specifically designed to minimize drift and enhance accuracy through AI processing techniques. This represents a significant improvement over traditional IMU implementations that often suffer from cumulative errors over time. The system achieves this enhanced performance without requiring external reference systems or complex sensor fusion algorithms, making it particularly suitable for autonomous operation in challenging environments.

Sensor Node Architecture and Components

Referring to FIG. 1, a single sensor node according to one embodiment includes an IMU with multiple sensing components. The sensor node comprises three main parts: an IMU sensor board containing a plurality of sensors including gyroscopes, accelerometers, and other sensors; a microcontroller unit (MCU) with AI processing capabilities; and an enclosure resistant to dust and water ingress and a sealed connection port. In one embodiment, the sensor node measures approximately 2×2 inches and meets the IP68 rated standard, though alternative embodiments may employ different form factors based on specific application requirements.

The gyroscopes in one embodiment comprise a 3-axis gyroscope system that measures angular velocity along the X, Y and Z axes of the sensor node. Each gyroscope is capable of measuring rotational velocities with high precision across a wide dynamic range. In alternative embodiments, additional gyroscopes may be incorporated to provide redundancy or enhanced accuracy for specific axes of rotation.

The accelerometers similarly comprise a 3-axis accelerometer system that measures acceleration and rate of change of velocity along the X, Y and Z axes. The accelerometers are selected and configured to provide accurate measurements across a wide range of accelerations, from subtle movements to high-G situations. Alternative embodiments may incorporate different accelerometer configurations or specifications based on the intended application's requirements.

In some embodiments, the other sensors may include various non-motion sensors for measuring environmental conditions such as temperature, structural strain (via strain gauges), magnetic fields, or other relevant parameters that could affect IMU performance. Temperature sensors are strategically placed to monitor both ambient and component-level temperatures, enabling real-time compensation for thermal effects. Strain gauges may be incorporated to detect structural deformation that could impact sensor readings, while magnetic field sensors can provide additional reference data for orientation calculations.

Enclosure and Physical Implementation

In some embodiments, the sensor node's enclosure is designed to resist dust and water ingress, enabling continuous operation when exposed to extreme environments. The enclosure incorporates sealing techniques and materials selected for their durability and thermal stability. Connection ports are specially designed to maintain the environmental resistance rating while providing reliable electrical connections. Alternative embodiments of the enclosure may be modified to accommodate different environmental requirements, such as versions designed for high-temperature environments incorporating additional thermal management features, or versions for aerospace applications including specialized EMI shielding or radiation-hardened components.

Microcontroller and Processing Architecture

In some embodiments, the processing device comprises a Teensy 4.1 microcontroller, configured to run AI models. This MCU allows for a balance of processing power, power consumption, and form factor. The MCU implements power management techniques to maximize battery life while maintaining processing performance. Alternative embodiments may employ different microcontrollers or processing architectures based on specific requirements, such as applications requiring additional processing power utilizing more powerful processors or incorporating secondary processing units for specific tasks. The system architecture is designed to be scalable, allowing for different processing configurations while maintaining the core functionality.

General Training Methodology

The training process for the deep neural network utilizes real-world simulation data collected under varying environmental conditions. Specialized testing platforms simulate all possible joint movements and orientations in three-dimensional space while simultaneously recording ground truth position data. This generates both general-purpose AI models and highly context-specific models optimized for particular joints or movement patterns.

In some embodiments, the training process incorporates contextual learning, where the system develops specialized models for different joint types and movement patterns. These models may be optimized for hip joints, knee joints, shoulder joints, or other specific applications, with each model incorporating specific constraints and characteristics relevant to its intended application. Environmental adaptation is achieved through collection of training data across a wide range of conditions, including temperature variations, vibration, electromagnetic interference, and other factors that might affect sensor performance.

The system's movement pattern recognition capabilities enable it to recognize and adapt to different types of movement patterns, from slow, precise movements to rapid, dynamic actions. This adaptability ensures high performance across various use cases and applications. Additionally, the system may incorporates mechanisms for continuous learning and adaptation during operation, allowing it to optimize performance based on actual usage patterns and conditions.

Neural Network Architecture and Implementation

A deep neural network architecture comprises multiple interconnected layers of nodes. The DNN includes an input node layer, multiple hidden node layers and an output node layer. Each node in the network layers combines input signals with learned coefficients or weights that amplify or dampen the input data based on extensive training. The neural network architecture incorporates transformer-based architectures, enabling more processing of sequential data and improved handling of temporal relationships in sensor readings.

In some embodiments, the network includes built-in uncertainty quantification mechanisms, enabling more reliable decision-making and improved safety features. Through adaptive processing capabilities, the network can dynamically adjust its processing based on current conditions and requirements, optimizing the balance between accuracy and computational efficiency.

Figure 2:
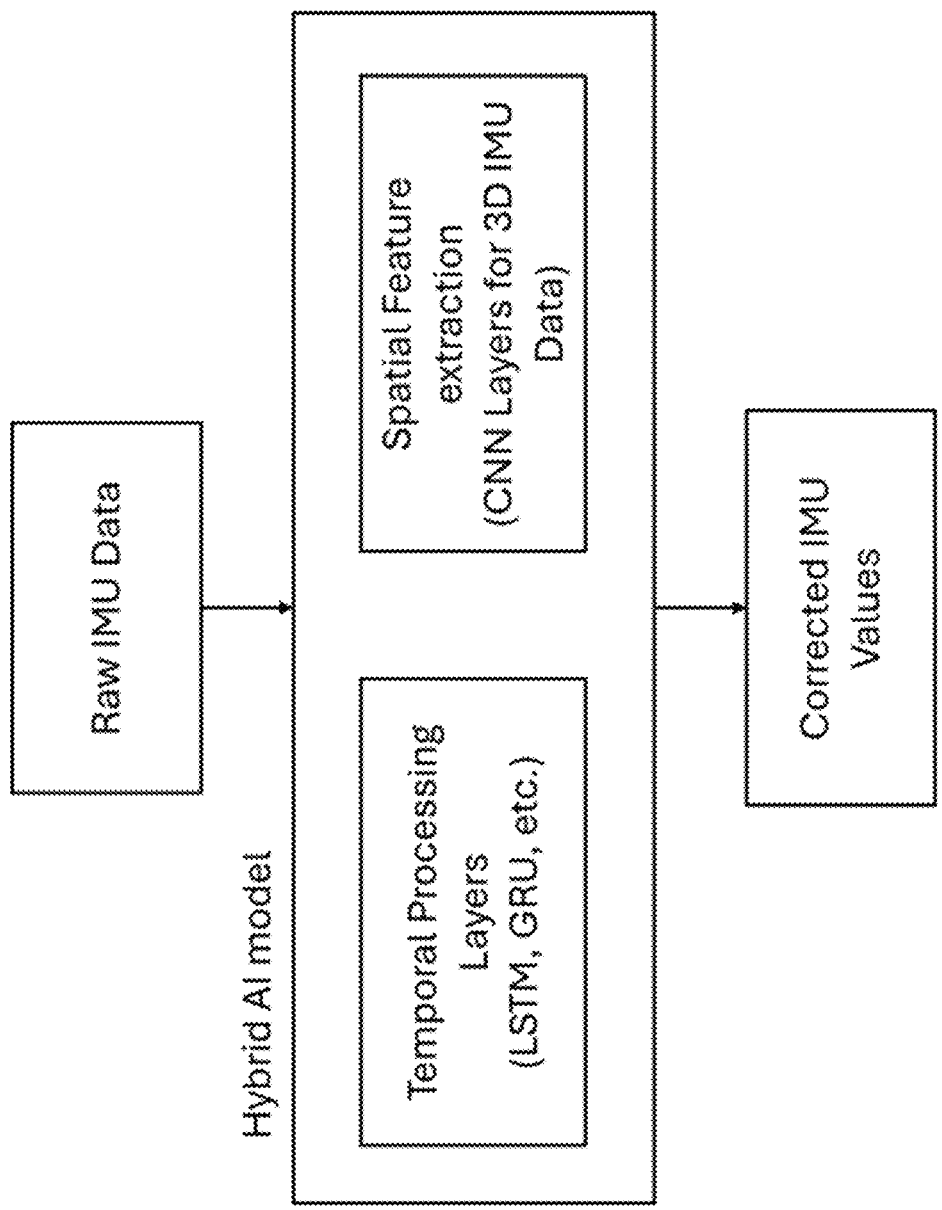
FIG. 2 is a schematic block diagram depicting the core neural network layers used in the AI model of the IMU calibration process.

FIG. 2 illustrates an example embodiment of a model architecture designed for Inertial Measurement Unit (IMU) calibration. The architecture comprises multiple interconnected stages that process and refine IMU sensor data to produce accurate, drift-compensated measurements.

The architecture begins with an input layer that aggregates data from multiple sources. This layer receives raw IMU sensor data, including measurements from accelerometers, gyroscopes, and magnetometers. Additionally, it incorporates contextual data such as gesture type, temperature, and humidity measurements. The input layer also accepts true ground data, which serves as a reference for training and calibration purposes.

Following the input stage, a preprocessing layer performs data conditioning operations. This stage implements noise filtering and normalization techniques to clean the incoming sensor data. In some embodiments, a feature of the preprocessing stage is its integration of synthetic datasets, which include both clean and deliberately noisy data samples. The noisy datasets are utilized to train the architecture's robustness to real-world interference. The preprocessing stage outputs conditioned IMU data optimized for subsequent model processing.

The core neural network layers form the central processing unit of the architecture. These layers implement a hybrid approach, combining temporal processing capabilities through Long Short-Term Memory (LSTM) or Gated Recurrent Unit (GRU) layers for sequential data analysis, with spatial feature extraction performed by Convolutional Neural Network (CNN) layers specialized for three-dimensional IMU data. This hybrid model architecture can process either raw sensor inputs or preprocessed data, outputting corrected six-degrees-of-freedom (6-DOF) or nine-degrees-of-freedom (9-DOF) data with integrated drift compensation.

The output layer generates the final calibrated measurements, providing corrected angular velocity and acceleration values, along with drift-compensated IMU measurements. These outputs are formatted for direct integration with control systems or feedback loops in the broader system architecture.

The architecture incorporates dedicated AI training and deployment modules. These modules operate within a cloud-based training environment, facilitating hyperparameter tuning and model evaluation. The architecture includes specific model optimization capabilities for edge devices, such as TensorFlow Lite implementations, enabling deployment to embedded hardware platforms like the Teensy 4.1 microcontroller.

In some embodiments, a feedback mechanism completes the architecture, implementing real-time monitoring capabilities that continuously analyze model predictions for accuracy and flag any discrepancies or abnormal behavior. This mechanism enables adaptive refinement through operational data, supporting iterative updates that drive continuous improvement in calibration accuracy. The feedback system may be used to ensures the model maintains performance throughout its operational lifetime, automatically adjusting to changing conditions and sensor characteristics.

Alternative Processing Architecture

Figure 3:
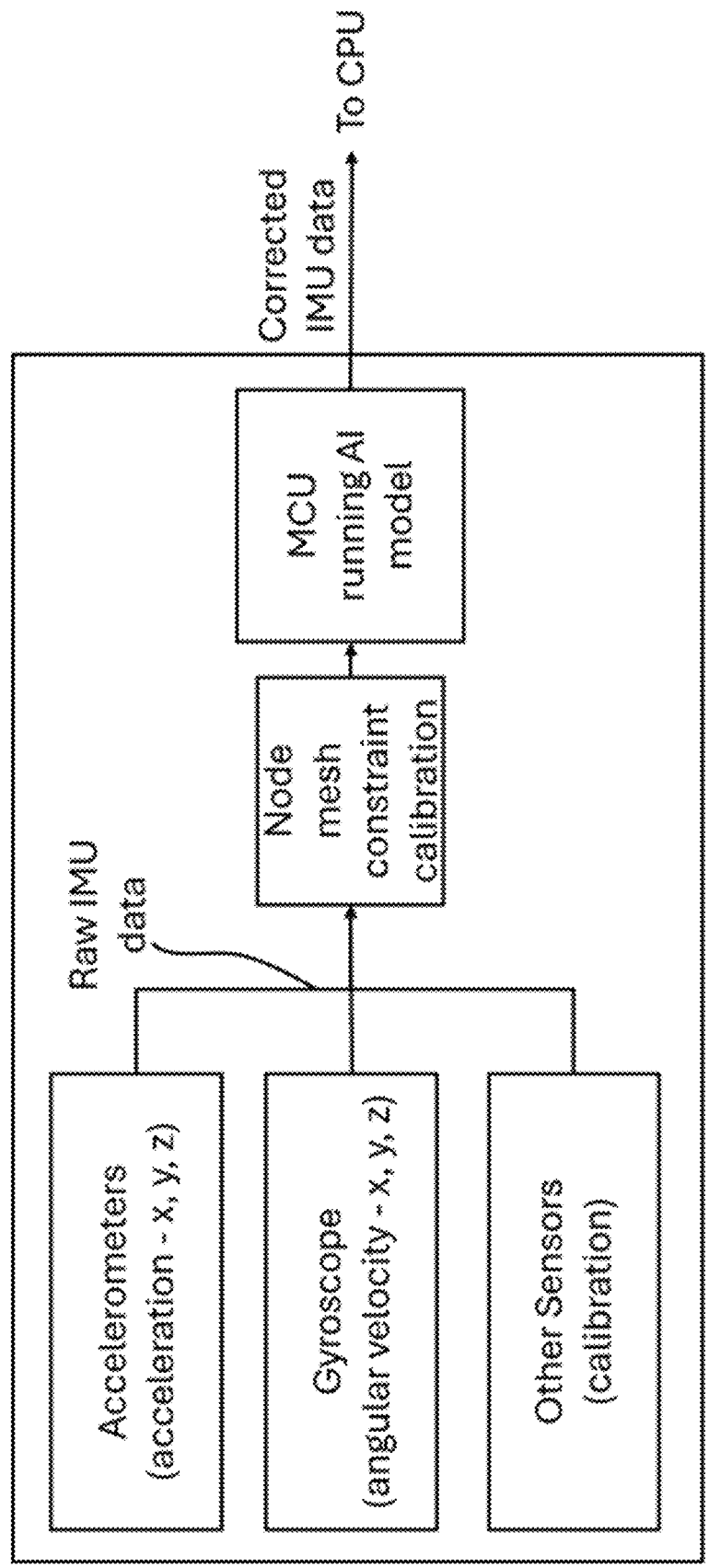
FIG. 3 is a schematic block diagram depicting an augmented IMU implementation according to one embodiment of the present disclosure, illustrating the integration of traditional calibration techniques with neural network processing using node mesh network constraint calibration techniques.

Referring to FIG. 3, an augmented IMU implementation is shown that demonstrates an alternative embodiment combining traditional processing techniques with neural network processing. The system includes gyroscopes, accelerometers, and environmental sensors similar to the embodiment of FIG. 1. However, in this implementation, the sensor outputs may optionally be processed by a pre-processing stage before being passed to the deep neural network. This architecture is particularly useful in scenarios where integration with legacy systems is required or where regulatory requirements mandate maintaining traditional processing paths alongside AI-enhanced capabilities.

In some embodiments, the pre-processing stage can apply various conditioning techniques to the sensor data before neural network processing. However, unlike traditional implementations that rely heavily on this pre-processing, in this embodiment the neural network is still trained on and capable of processing raw sensor data directly. This hybrid architecture enables the system to operate in multiple modes: a direct raw data processing mode that minimizes latency, a pre-processed mode that may be required for certain applications, and a dual-path mode that can compare and validate results between both approaches. The DNN enhances the signals using deep learning techniques regardless of the input path chosen. This flexibility makes the system particularly adaptable to different operational requirements while maintaining the core advantages of AI-enhanced processing.

Training and Implementation

Figure 4:
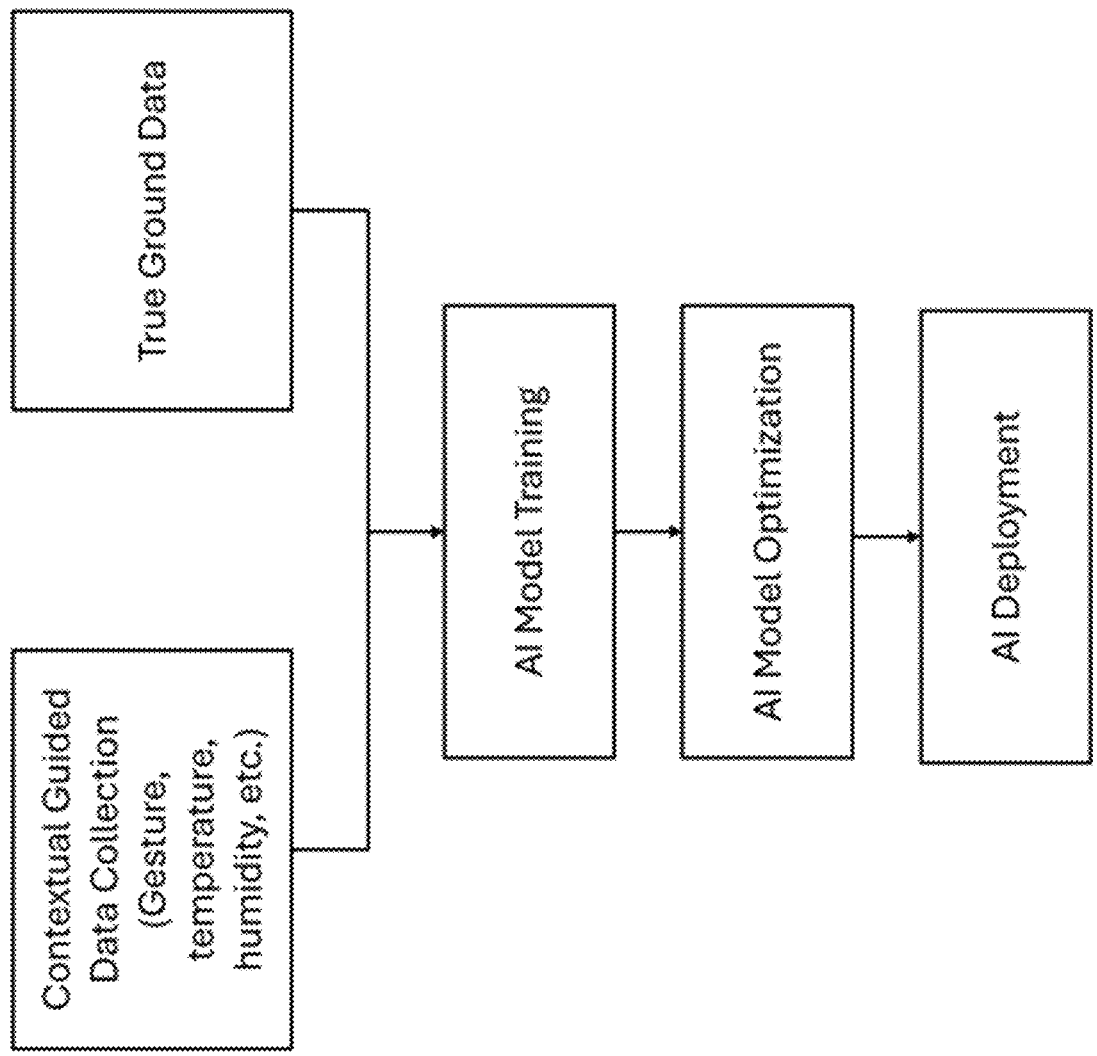
FIG. 4 is a flow diagram illustrating the method of training and deploying deep learning models according to one embodiment of the present disclosure, showing the process from contextual guided raw data collection compared to true ground data. After the model is developed it goes through an optimization process so that it runs efficiently on a single board MCU or CPU.

The method of training and deploying the deep learning models is illustrated in FIG. 4. The process begins with receiving raw voltage values directly from the IMU sensors, a key differentiator from traditional approaches that rely on pre-conditioned data. The system collects these raw values along with corresponding ground truth position data using high-precision measurement systems during the training phase. These paired datasets are then used to train specialized models for different joint types and movement patterns.

In some embodiments, the training process leverages deep learning architectures including transformer models and incorporates uncertainty quantification mechanisms. This enables the system to not only predict position and orientation but also provide confidence levels for its predictions, enhancing system safety and reliability. The training data includes extensive real-world simulations of joint movements, environmental variations, and potential fault conditions. By incorporating joint-specific physical constraints during the training process, the system develops highly specialized models that understand the mechanical limitations and characteristics of different joint types. This specialized training approach significantly reduces computational overhead during operation while improving accuracy.

Integrated Navigation Architecture

Figure 5:
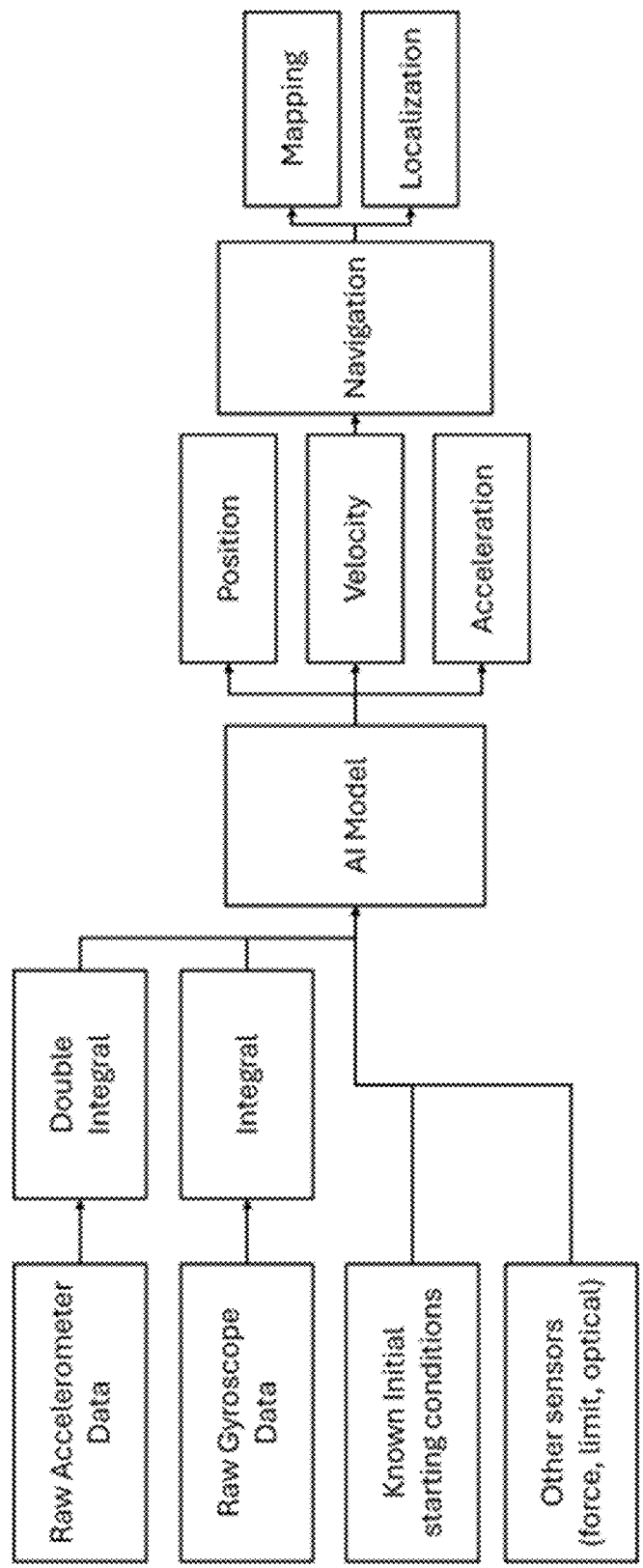
FIG. 5 is a schematic block diagram depicting an inertial navigation system implementing the enhanced IMU technology according to one embodiment of the present disclosure, showing the integration of the IMU with navigation processing components. Assuming the initial starting conditions are known and previously mapped, the IMU sensor will be able to localize itself within its environment. Alternatively, sensor fusion can be used to simultaneously localize and map the environment. These sensors can be significantly less computationally and economically expensive and technically simple by utilizing current and/or force sensors to sense when the IMU is being blocked by an obstacle. In the case of a current sensor, the actuators will draw higher than normal current without the joints moving which will indicate an obstacle blocking. In the case of the force sensor the obstacle will read as a voltage change in the force or pressure sensor.

Referring to FIG. 5, an inertial navigation system implements the enhanced IMU technology in a complete navigation solution. The system includes an IMU with gyroscopes and accelerometers providing input to a navigation processor. The navigation processor incorporates a DNN that processes the raw sensor inputs to generate navigation parameters including velocity, attitude, position, and depth. This direct processing of raw sensor values, combined with the neural network architecture, enables the system to achieve high accuracy without relying on external reference systems or complex sensor fusion algorithms.

In some embodiments, the navigation processor employs the same processing architecture described herein, enabling AI processing directly at the sensor level. This distributed processing approach significantly reduces latency while maintaining high accuracy. The processor can dynamically adjust its processing based on environmental conditions and movement patterns, optimizing both performance and power consumption. The system can operate independently for local navigation or as part of the broader virtual skeleton network, where multiple nodes work together to maintain a complete model of the robotic system. In virtual skeleton implementations, the navigation data from each node contributes to the overall skeletal model while also maintaining local navigation capabilities. This dual-purpose functionality enables behaviors like self-collision prediction and joint constraint enforcement while providing accurate position and orientation data.

Virtual Skeleton Implementation and Networking

The virtual skeleton feature represents a significant advancement over existing IMU implementations. Multiple sensor nodes can be meshed networked together to create a complete skeletal model of a robotic system. In one embodiment, approximately 12 sensor nodes are used per humanoid robot, though the actual number may vary based on the specific application and required level of detail. By using the meshed network of nodes the virtual skeleton can self-calibrate by utilizing context constraints for each joint node or point of interest.

In some embodiments, the virtual skeleton system incorporates physical constraints such as joint movement limitations and fixed distances between connection points directly into the AI model, reducing computational overhead while improving accuracy. Through real-time mapping capabilities, the system maintains a three-dimensional model of all robot components and their spatial relationships, enabling collision prediction and movement optimization. Computational tasks are distributed across the network of sensor nodes, optimizing overall system performance and reducing latency.

Communication Architecture and Integration

An ESP32 or similar wireless communication module handles data transmission between the sensor node and other system components. This includes communication with other sensor nodes, a central CPU, internal servers, external cloud services, and over-the-air programming capabilities. The communication system implements protocols for reliable data transmission and synchronization across the sensor network.

Alternative embodiments may employ different communication architectures based on specific requirements. For applications requiring maximum reliability or minimal latency, wired communication protocols may be implemented. Some embodiments may combine wireless and wired communication for different aspects of system operation. Advanced mesh networking protocols enable reliable communication even when individual nodes are temporarily unavailable or experiencing interference.

Safety Features and System Monitoring

The system incorporates comprehensive safety features that enhance reliability and fault tolerance. The neural network continuously monitors kinematic parameters including velocity, acceleration, jerk, and even higher derivatives of position to detect anomalous conditions. When movement exceeds predefined thresholds or exhibits unexpected patterns, the system can trigger rapid response mechanisms that bypass normal control architecture to prevent damage or unsafe operation.

In some embodiments, the safety system employs predictive analysis to analyze movement patterns and predict potential issues before they occur, enabling proactive intervention. Multiple sensors and processing pathways provide redundancy for critical measurements and calculations. Systems continuously monitor system health and performance, detecting potential issues early and enabling preventative maintenance.

Testing and Validation Methodologies

Figure 6:
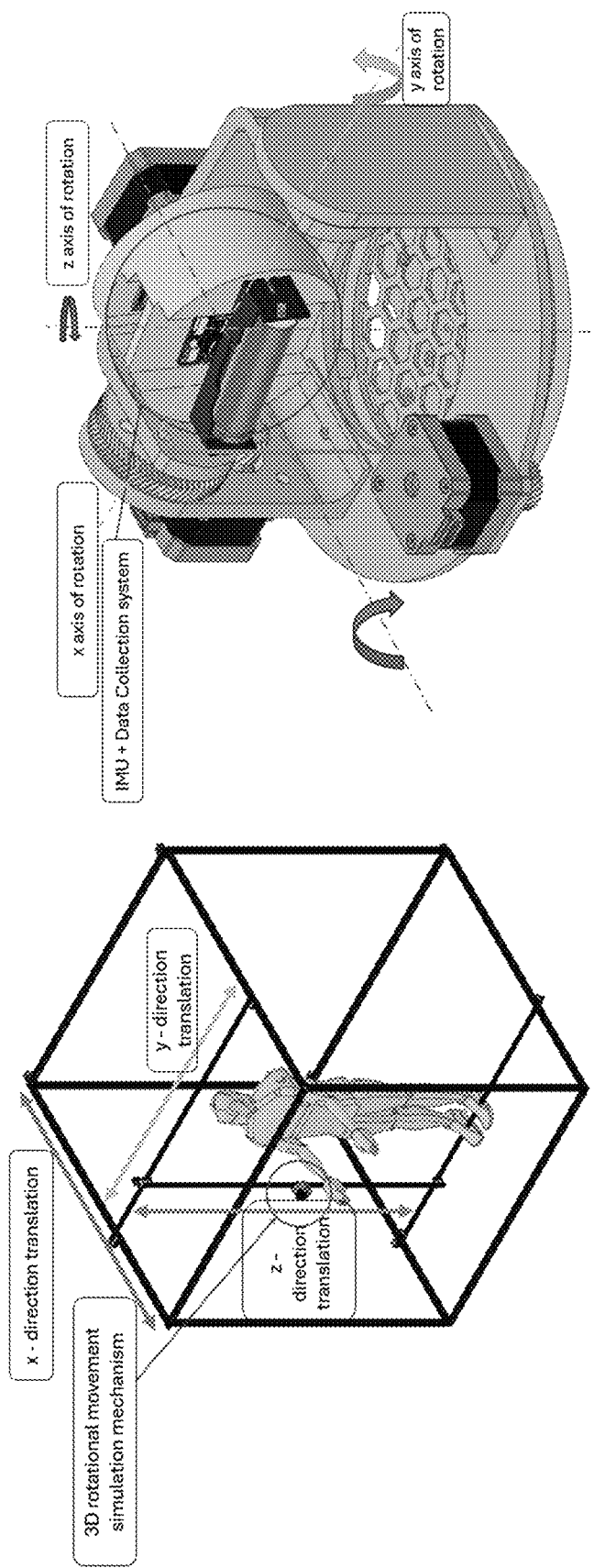
FIG. 6 is a diagram depicting an experimental platform for validation testing according to one embodiment of the present disclosure, illustrating the setup for executing complex kinematic pathways and comparing IMU-derived position data against reference measurements.

The system employs several testing configurations for validation and demonstration. Referring to FIG. 6, the first demonstration utilizes an experimental platform that executes kinematic pathways while comparing the IMU-derived position data against reference measurements. This approach demonstrates the system's ability to maintain accuracy during high-jerk and high-snap movements.

Figure 7:
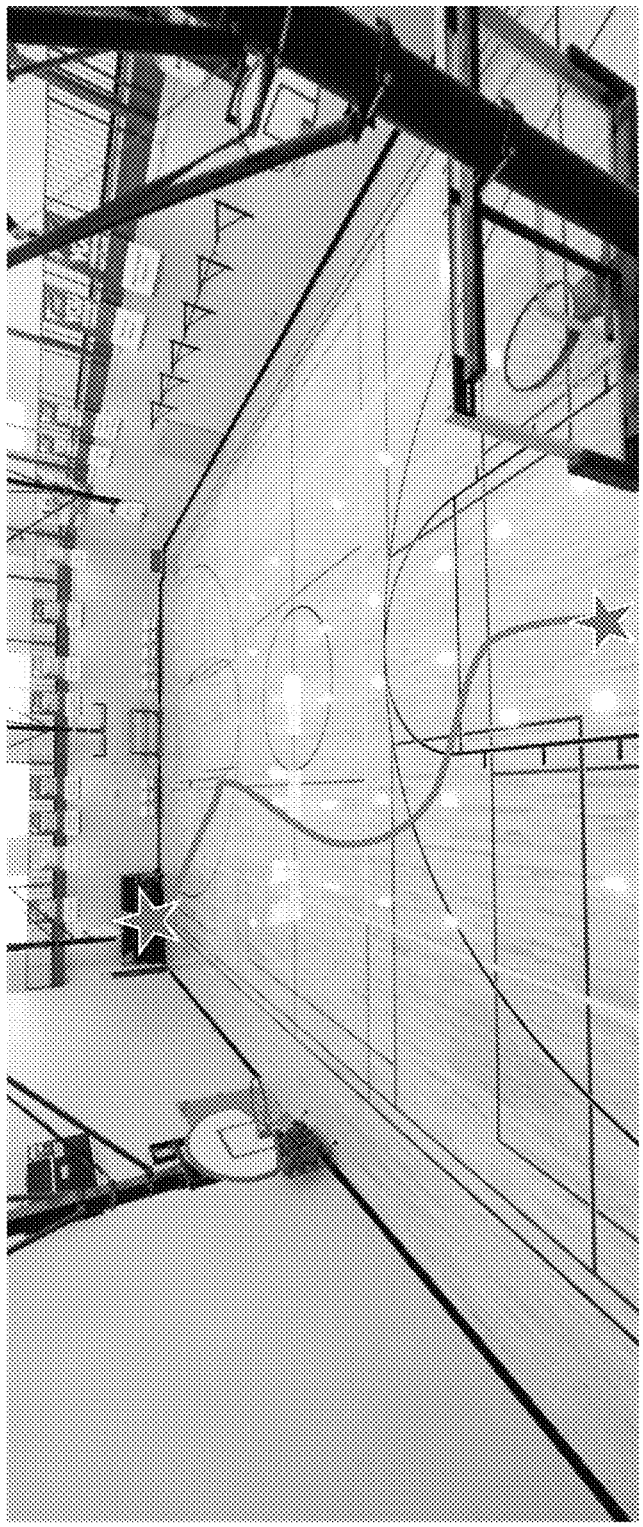
FIG. 7 is a diagram depicting the experimental setup for long-distance navigation testing according to one embodiment of the present disclosure, showing the gymnasium testing environment with defined start and end points.
Figure 8:
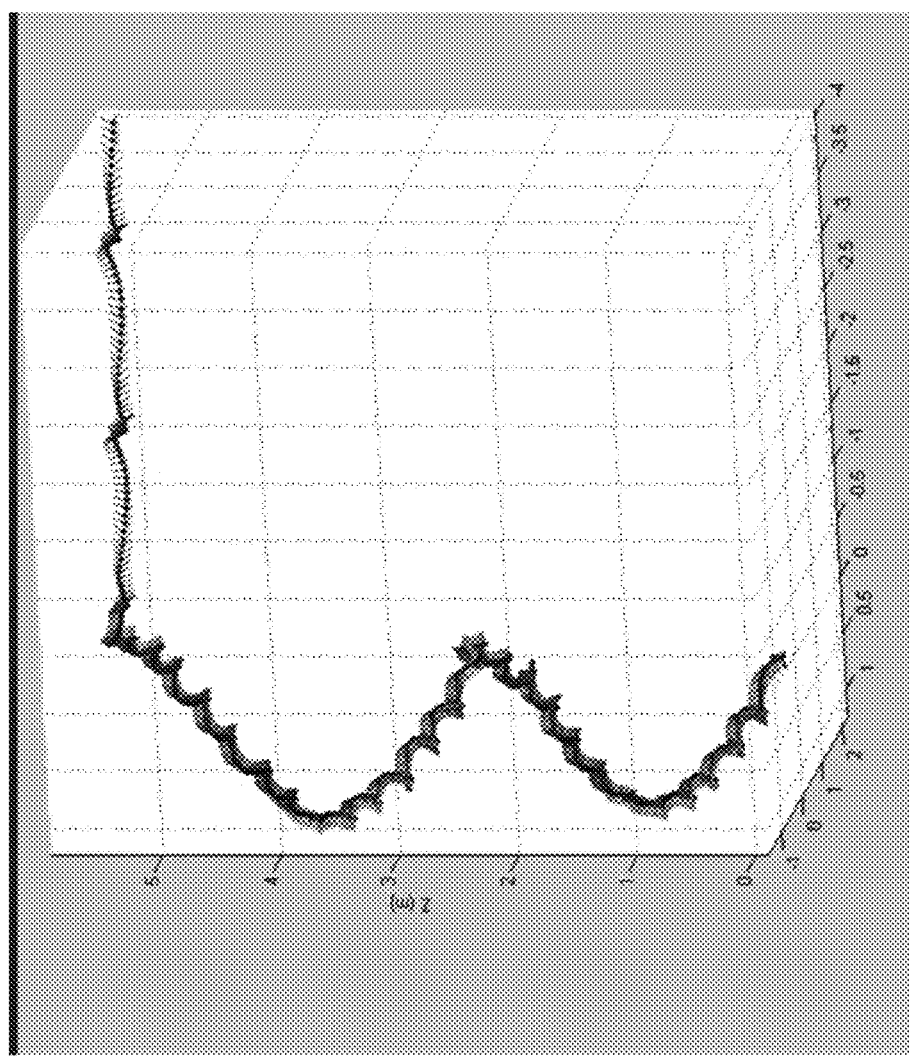
FIG. 8 is a graph showing example IMU plot data in real-time according to one embodiment of the present disclosure, illustrating the comparison between corrected and uncorrected IMU data during operation.
Figure 9:
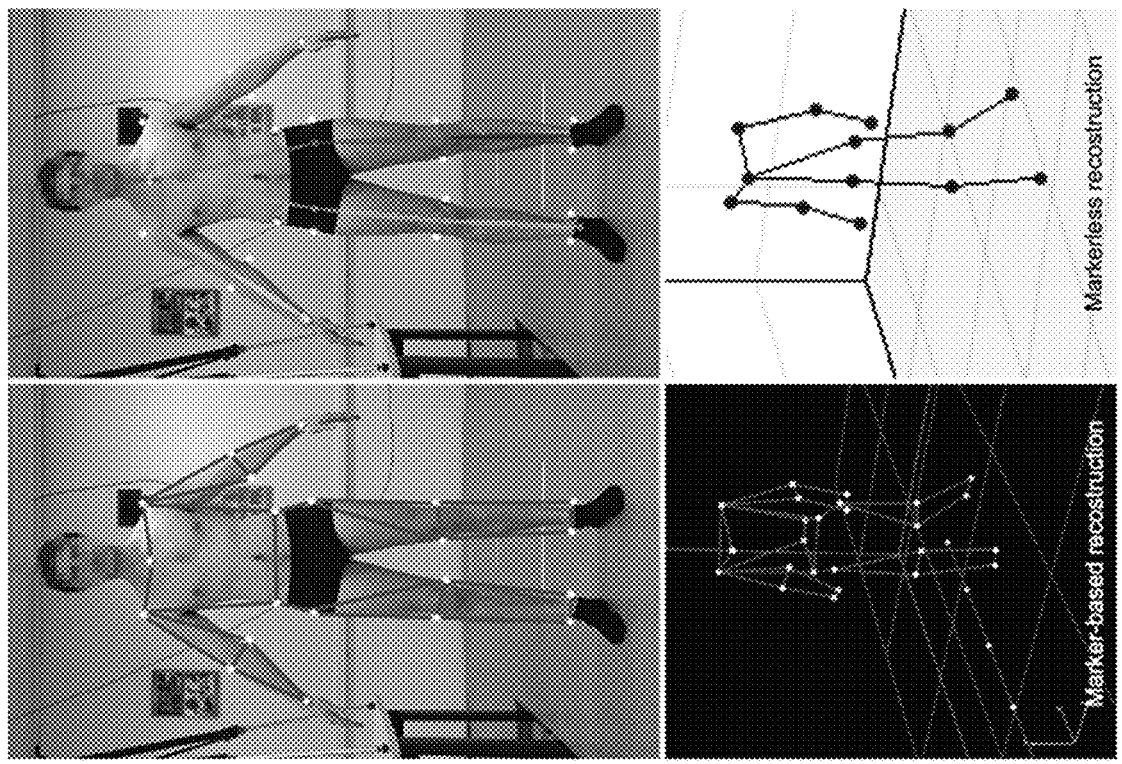
FIG. 9 is a diagram depicting a virtual skeleton implementation using external camera and markers according to one embodiment of the present disclosure, showing the reference system used for validation of the IMU-based virtual skeleton.

A second demonstration, illustrated in FIG. 7, involves long-distance navigation using only IMU data. This test validates the system's ability to minimize drift over extended operations and demonstrates its capability to maintain accurate positioning without external references. The third demonstration, shown in FIG. 9, specifically validates the virtual skeleton implementation using a high-precision humanoid robot, combining encoder data from each joint with an external vision tracking system to generate a reference skeleton model.

Developer Integration and Tooling

In some embodiments, the system includes development and integration tools that enable efficient implementation and optimization. Real-time visualization capabilities allow developers to observe and analyze system operation, including virtual skeleton movement and sensor performance. A comprehensive simulation environment enables testing and validation of control algorithms before deployment. Well-documented APIs enable seamless integration with existing robotic control systems and development environments.

Alternative Embodiments and Applications

While the described embodiments focus primarily on humanoid robotics applications, the system's architecture and methodology can be adapted for various other applications. The system can be adapted for precise control of industrial robots and machinery, enabling more automation capabilities. Modified versions of the system could be used for medical motion tracking and rehabilitation applications. Specialized configurations could be developed for aerospace navigation and satellite control applications. The system's precise motion tracking capabilities could be adapted for virtual and augmented reality applications.

Through these various embodiments and implementations, the present disclosure provides significant advances in IMU technology by combining AI processing with efficient edge computing to enable more accurate and reliable motion tracking while reducing dependence on external sensing systems.

Various features and advantages are set forth in the following claims.

What is claimed is:

1. A method comprising:
receiving sensor data from a plurality of inertial measurement unit (IMU) sensors physically distributed at different locations on a humanoid robot operating in an environment without external reference systems;
processing the sensor data using a neural network implemented on a processing device;
generating position and orientation data based on the processed sensor data;
creating a virtual model by networking multiple IMU sensors together, wherein the virtual model incorporates physical constraints of the humanoid robot being monitored; and
continuously self-calibrating individual IMU sensors during operation by applying context constraints specific to each IMU sensor's mounting location on the humanoid robot, wherein the self-calibration utilizes physical constraints including joint movement limitations and fixed distances between connection points to reduce accumulated sensor drift and enables autonomous operation in challenging environments.

2. The method of claim 1, wherein the neural network comprises a model trained for specific humanoid movement patterns particular to the system being monitored.

3. The method of claim 1, further comprising: monitoring kinematic parameters of the system being monitored; detecting conditions based on the monitored parameters; and triggering response mechanisms when specific conditions are detected.

4. The method of claim 1, wherein the virtual model enables collision prediction by maintaining a real-time model of components and their spatial relationships.

5. The method of claim 1, further comprising:
collecting simulation data under varying conditions;
training the neural network based on the collected simulation data, wherein the training comprises:
training different humanoid movement patterns;
incorporating movement constraints specific to each humanoid joint; and
collecting operational data during deployment and updating the neural network based on usage patterns;
wherein the collection of operational data includes recording actual humanoid robot movements in the environment without external reference systems.

6. The method of claim 5, further comprising:
collecting additional operational data during deployment including data reflecting physical constraints and movement limitations of humanoid joints being monitored; and
dynamically updating the neural network models based on the additional operational data to further improve calibration accuracy during extended operation.

7. The method of claim 1, wherein processing the sensor data comprises directly processing raw voltage values from the IMU sensors without pre-calibration or pre-processing steps.

8. The method of claim 1, wherein the context constraints include joint movement limitations specific to humanoid joint types selected from hip joints, knee joints, and shoulder joints.

9. The method of claim 1, wherein the self-calibration incorporates fixed distances between connection points of the humanoid robot into the virtual model.

10. The method of claim 1, further comprising implementing a feedback mechanism that continuously analyzes model predictions for accuracy and enables adaptive refinement through operational data during extended operation.

11. A system comprising:
a plurality of sensor nodes physically distributed at different locations on a humanoid robot operating in an environment without external reference systems, each sensor node comprising:
an IMU sensor board;
a processor configured to implement AI processing; and
an enclosure;
wherein the sensor nodes are networked together to form a virtual model;
wherein each sensor node's processor implements a continuous self-calibration process that applies context constraints specific to that sensor's mounting location to reduce accumulated sensor drift; and
wherein the virtual model maintains accurate navigation data during autonomous operation in challenging environments by leveraging the self-calibration processes across the networked sensor nodes.

12. The system of claim 11, wherein the processor implements neural network architectures.

13. The system of claim 11, wherein the processor implements uncertainty quantification mechanisms to provide confidence levels for position and orientation predictions.

14. The system of claim 11, wherein the virtual model self-calibrates using context constraints specific to each sensor node location, wherein the context constraints include at least one of:
fixed distances between humanoid joint connection points,
humanoid joint movement limitations,
movement patterns specific to ankle, knee, hip, or shoulder joints, and
physical constraints of the humanoid robot platform.

15. A system for motion tracking, comprising:
a plurality of IMU sensor nodes physically distributed and networked together on a humanoid robot operating in an environment without external reference systems;
each sensor node comprising a processor implementing a neural network model;
wherein the networked sensor nodes form a virtual model incorporating physical constraints of the humanoid robot being monitored; and
wherein each sensor node's neural network model implements a self-calibration process that:
identifies contextual motion patterns specific to that sensor's mounting location on the humanoid robot;
applies physical constraints based on the identified contextual motion patterns; and dynamically adjusts sensor calibration parameters to maintain accurate position and orientation data during autonomous operation in challenging environments.

16. The system of claim 15, wherein the processor implements predictive analysis to detect potential issues based on monitored parameters.

17. The system of claim 15, wherein the neural network model implements a hybrid architecture combining temporal processing through LSTM or GRU layers with spatial feature extraction through CNN layers specialized for three-dimensional IMU data.

18. The system of claim 15, wherein the processor implements adaptive processing capabilities to dynamically adjust processing based on current conditions and requirements, optimizing between accuracy and computational efficiency.

19. A method for validating a networked IMU system for autonomous navigation of a humanoid robot, comprising:

executing movement patterns on a humanoid robot equipped with a plurality of networked IMU sensors physically distributed at different locations on the robot;

comparing IMU-derived position data against reference measurements;

validating virtual model accuracy using external reference data; and verifying self-calibration performance by measuring position and orientation accuracy during extended operation in an environment without external reference systems.

20. The method of claim 19, wherein validating virtual model accuracy comprises:

generating a reference model using sensor data; and comparing the IMU-based virtual model against the reference model.

\* \* \* \* \*